United States Patent
Kobla et al.

(10) Patent No.: US 9,236,143 B2
(45) Date of Patent: Jan. 12, 2016

(54) GENERIC ADDRESS SCRAMBLER FOR MEMORY CIRCUIT TEST ENGINE

(75) Inventors: Darshan Kobla, Austin, TX (US); David Zimmerman, El Dorado Hills, CA (US); Vimal Natarajan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 199 days.

(21) Appl. No.: 13/997,641

(22) PCT Filed: Dec. 28, 2011

(86) PCT No.: PCT/US2011/067674
§ 371 (c)(1), (2), (4) Date: Jun. 24, 2013

(87) PCT Pub. No.: WO2013/101006
PCT Pub. Date: Jul. 4, 2013

(65) Prior Publication Data
US 2014/0237307 A1    Aug. 21, 2014

(51) Int. Cl.
*G11C 29/12* (2006.01)
*G06F 12/00* (2006.01)
*G06F 12/14* (2006.01)
*G11C 29/18* (2006.01)

(52) U.S. Cl.
CPC ............ *G11C 29/12* (2013.01); *G06F 12/1408* (2013.01); *G11C 29/18* (2013.01); *G11C 2029/1806* (2013.01)

(58) Field of Classification Search
CPC ............ G11C 29/12; G11C 2029/1806; G06F 12/1408
See application file for complete search history.

(56) References Cited

U.S. PATENT DOCUMENTS

| | | | |
|---|---|---|---|
| 4,453,212 A | 6/1984 | Gaither et al. |
| 4,928,223 A | 5/1990 | Dao et al. |
| 5,197,132 A | 3/1993 | Steely, Jr. et al. |
| 5,961,634 A | 10/1999 | Tran |
| 6,452,848 B1 | 9/2002 | Obremski et al. |
| 6,658,611 B1 | 12/2003 | Jun |
| 7,302,623 B2 | 11/2007 | Kang |

(Continued)

FOREIGN PATENT DOCUMENTS

| JP | 2001043698 | 2/2001 |
|---|---|---|
| JP | 2001-243793 | 9/2001 |

(Continued)

OTHER PUBLICATIONS

International Search Report and Written Opinion of the International Searching Authority dated Nov. 23, 2012, in International Patent Application No. PCT/US2012/031430, 9 pages.

(Continued)

*Primary Examiner* — Aracelis Ruiz
(74) *Attorney, Agent, or Firm* — Blakely, Sokoloff, Taylor & Zafman LLP

(57) ABSTRACT

A generic address scrambler for a memory circuit test engine. An embodiment of a memory device includes a memory stack having one or more of coupled memory elements, a built-in self-test circuit including a generic programmable address scrambler for the mapping of logical addresses to physical addresses for the memory elements, and one or more registers to hold programming values for the generic programmable address scrambler.

17 Claims, 7 Drawing Sheets

(56) References Cited

U.S. PATENT DOCUMENTS

| | | | |
|---|---|---|---|
| 7,444,575 | B2 | 10/2008 | Ong |
| 7,676,709 | B2 | 3/2010 | Chan |
| 8,208,326 | B1 * | 6/2012 | Solt et al. ............ 365/201 |
| 2006/0233012 | A1 | 10/2006 | Sekiguchi et al. |
| 2007/0143568 | A1 * | 6/2007 | Gould ............ 711/203 |
| 2007/0208970 | A1 | 9/2007 | Marinissen et al. |
| 2008/0178053 | A1 | 7/2008 | Gorman et al. |
| 2008/0263414 | A1 | 10/2008 | Saito et al. |
| 2009/0059641 | A1 | 3/2009 | Jeddeloh |
| 2009/0103345 | A1 | 4/2009 | McLaren et al. |
| 2009/0224388 | A1 | 9/2009 | Bernstein et al. |
| 2009/0295420 | A1 | 12/2009 | Shiba |
| 2010/0332177 | A1 | 12/2010 | Wu et al. |
| 2011/0161748 | A1 | 6/2011 | Casper et al. |
| 2013/0294184 | A1 | 11/2013 | Yang et al. |
| 2014/0237307 | A1 | 8/2014 | Kobla et al. |

FOREIGN PATENT DOCUMENTS

| | | |
|---|---|---|
| JP | 2008-269669 | 11/2008 |
| JP | 2010-182366 | 8/2010 |
| KR | 10-2005-0030987 | 4/2005 |
| TW | 201101316 | 1/2011 |
| WO | WO-2013/147841 | 10/2013 |

OTHER PUBLICATIONS

International Search Report and Written Opinion of the International Searching Authority dated Sep. 19, 2012, in International Patent Application No. PCT/US2011/067674, 9 pages.

Office Action mailed Dec. 2, 2014, in U.S. Appl. No. 13/997,156, 19 pages.

Notice of Allowance mailed Mar. 18, 2015, in U.S. Appl. No. 13/997,156, 9 pages.

Notice of Reasons for Rejection dated Jul. 7, 2015 (+ English translation), in Japanese Patent Application No. 2014-550256, 4 pages.

Official Letter dated Apr. 13, 2015 (+ English translation), in Taiwan Patent Application No. 101147162, 6 pages.

Office Action dated Jul. 7, 2015 (+ English translation), in Taiwan Patent Application No. 102109496, 18 pages.

* cited by examiner

200

| LOGICAL ADDRESS ROW 210 | PHYSICAL ADDRESS ROW 220 | LOGICAL ADDRESS COLUMN 230 | PHYSICAL ADDRESS COLUMN 240 |
|---|---|---|---|
| X0 | X0 XOR X1 | Y0 | Y5 |
| X1 | X1 XOR X2 | Y1 | Y2 |
| X2 | X2 XOR X3 | Y2 | Y6 |
| X3 | X3 | Y3 | Y0 |
| X4 | X4 | Y4 | Y3 |
| X5 | X5 | Y5 | Y4 |
| X6 | X6 | Y6 | Y1 |

FIG. 2

GENERIC ADDRESS SCRAMBLER FOR MEMORY CIRCUIT TEST ENGINE

TECHNICAL FIELD

Embodiments of the invention generally relate to the field of electronic devices and, more particularly, to a generic address scrambler for a memory circuit test engine.

BACKGROUND

To provide more dense memory for computing operations, concepts involving memory devices (which may be referred to as 3D stacked memory, or stacked memory) having a plurality of closely coupled memory elements have been developed.

A 3D stacked memory may include coupled layers or packages of DRAM (dynamic random-access memory) memory elements, which may be referred to as a memory stack. Stacked memory may be utilized to provide a great amount of computer memory in a single device or package, where the device or package may also include certain system components, such as a memory controller and CPU (central processing unit).

As memory devices increase in size and complexity, there is an increase need for effective and efficient testing of such devices, where testing includes accessing each physical address of the memory.

However, the memory dies within a stacked memory device may vary in design, and in particular such memory may vary in the logical to physical addressing of the memory, thereby complicating the task of providing a complete test of the memory device.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 2 is an illustration of a DRAM in an embodiment of a memory device;

DETAILED DESCRIPTION

Figure 1:
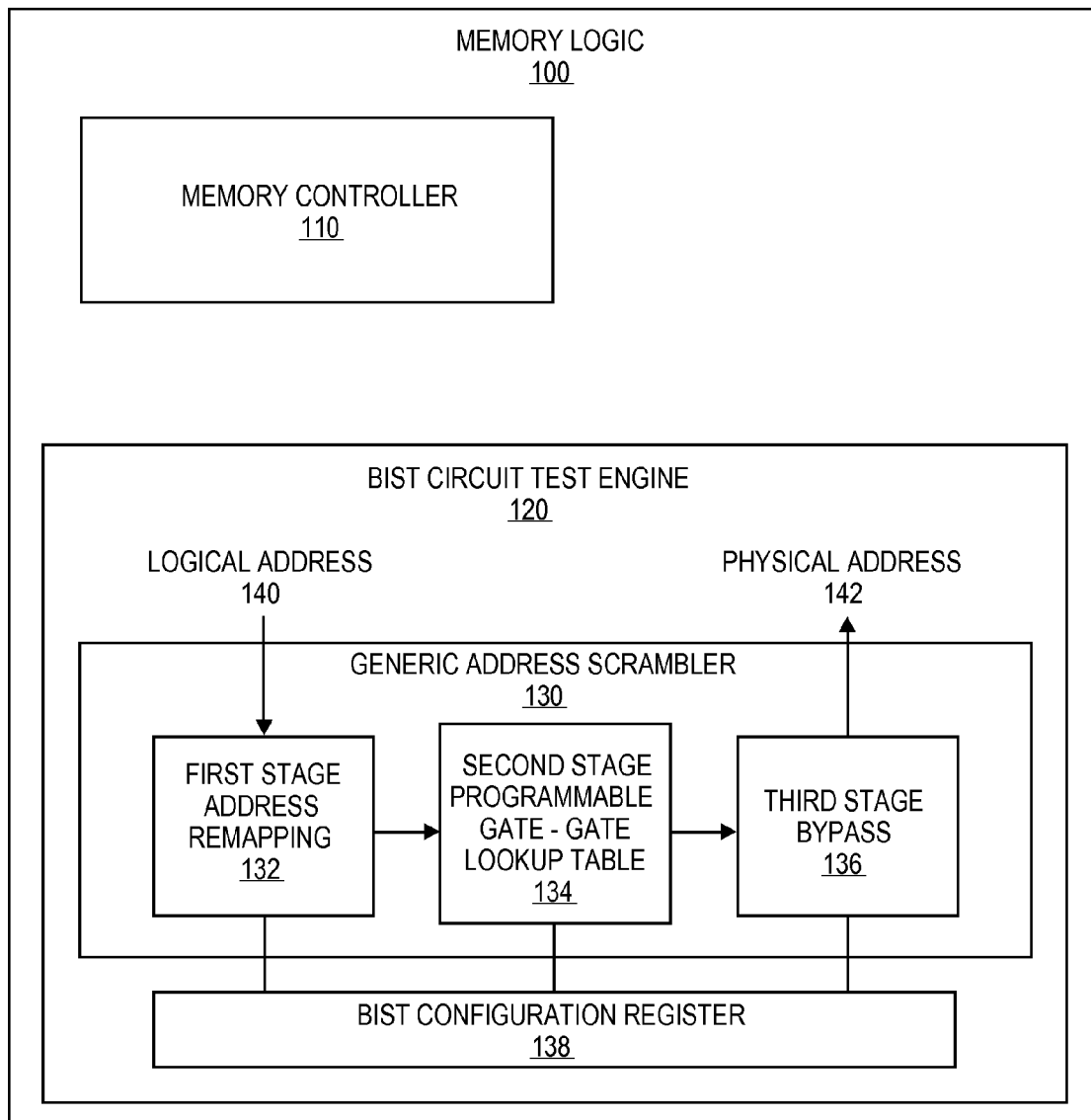
FIG. 1 illustrates an embodiment of logic of a stacked memory device.

Embodiments of the invention are generally directed to a generic address scrambler for a circuit test engine.

As used herein:

"3D stacked memory" (where 3D indicates three-dimensional) or "stacked memory" means a computer memory including multiple coupled memory layers, memory packages, or other memory elements. The memory may be vertically stacked or horizontally (such as side by side) stacked, or otherwise contain memory elements that are coupled together. In particular, a stacked memory DRAM device or system may include a memory device having a plurality of DRAM layers. A stacked memory device may also include system elements in the device, such as a CPU (central processing unit), a memory controller, and other related system elements. The system layer may include a logic chip or a system on chip (SoC). A stacked memory device may include through silicon vias (TSVs) for providing interconnections between die layers. In some embodiments, the logic chip may be an application processor or graphics processing unit (GPU).

A stacked memory device includes memory elements and a system element in a package. For example, a memory device may include a WideIO DRAM standard device having a memory stack of DRAM wafers coupled with a logic chip or element, such as system on chip (SoC), wafer in the same package utilizing Through Silicon Via (TSV) manufacturing. The combination of TSV and WideIO DRAM (and future standards) may provide in area savings for device manufacture, platform power savings, and an increase in system performance.

However, the stacked memory device assembling processes and TSV manufacturing can potentially introduce defects, and hence requires rigorous DRAM testing. The BIST (Built in self test) circuit test engine is used to test Memories/Arrays. To effectively test memories the algorithms programmed in the BIST engine should access the physical memory address, where stacked memory devices may utilize varying types of memory chips from different manufacturers with differing addressing.

In some embodiments, a BIST circuit test engine of a stacked memory device includes a generic programmable address scrambler providing L2P (logical to physical) address mapping for testing of the memory device. In some embodiments, the circuit test engine may provide:

(1) Support for multiple different mapping schemes, such as DRAM suppliers that use different L2P mapping schemes with TSV technology. Multiple different suppliers may be chosen to meet the supply and demand for high volume products.

(2) Support for multiple different products, including handheld and tablet devices as well as larger computing systems and servers, through use of generic address scrambling.

(3) Operation without requiring hardware or design changes for different memories. In some embodiments, the address scrambling is programmable and the BIST engine is process independent.

(4) Enabling physical addressing in algorithms to provide improved defect detection, and thus allow for a better manufacturing yield for memory devices.

For effective testing of memories, the algorithms programmed in the BIST engine should access the physical memory address. However, a logical to physical address (L2P) relationship does not typically have a one to one mapping and is governed by a scrambling function. The address scrambling function can vary in implementation from a simple wire connectivity remapping of the address bits or can involve combinational gates.

In some embodiments, in contrast with conventional devices, a generic address scrambler includes programmable gates to provide flexible operation in memory testing. In some embodiments, a generic address scrambler includes at least three stages using multiplexers (muxes).

In some embodiments, a first stage of a generic address scrambler corresponds to the address remapping, where each address bit is individually remapped to a corresponding physical address bit. In some embodiments, a second stage of the generic address scrambler is a programmable gate with the multiplexer inputs being coupled with a gate lookup table of the logic gate and the multiplexer controls coupled to an output of the first stage. In some embodiments, a third stage of the generic address scrambler includes a multiplexer to optionally bypass the second stage. In some embodiments, the multiplexer controls for the first and third stage and the gate lookup table (second stage) are a part of a programmable register.

A BIST engine including a generic address scrambler may be used to provide for testing at various time in manufacture and operation of a stacked memory device. In some embodiments, a BIST engine with a generic address scrambler may be used by manufacturers to screen defective parts. In some embodiments, when enabled for OS (operating system) boot, the BIST engine may be used to support Power on Self-Test (POST) to detect reliability-related failures. In some embodiments, the generic address scrambler may be used to enable the BIST raster (diagnostic) feature during debug to pinpoint exact failing locations.

In some embodiments, a memory device includes a memory stack having one or more of coupled memory elements, a built-in self-test circuit including a generic programmable address scrambler for the mapping of logical addresses to physical addresses for the memory elements, and one or more registers to hold programming values for the generic programmable address scrambler.

FIG. 1 illustrates an embodiment of logic of a stacked memory device. In some embodiments, the memory logic 100 of a stacked memory device (such a SoC chip as a WideIO memory device) includes a memory controller 110 for the control of the memory stack and a BIST circuit test engine 120 for testing of the memory. In the testing of the memory, there is a need for addressing the physical address of each memory, where the memory addressing may vary depending on the particular memory die included in a stacked memory device. In some embodiments, the BIST circuit test engine 120 of the memory logic 100 includes a generic programmable address scrambler 130 for mapping of logical memory addresses 140 to physical memory addresses 142.

In some embodiments, the generic address scrambler 130 includes at least three stages, the stages including a first stage 132 to provide address remapping, where each address bit is individually remapped to a corresponding physical address bit; a second stage 134 including a programmable logic gate, such as utilizing a gate lookup table to provide gate characteristics; and a third stage 136 to provide for optionally bypassing the second stage 134. In some embodiments, controls for the first stage 132 and the third stage 136 and the gate lookup table of the second stage 134 are provided in a programmable register (which may be a part of the address scrambler or may be a separate register), such as BIST configuration register 138.

FIG. 2 is an illustration of a DRAM in an embodiment of a memory device. In this illustration, a DRAM 100 includes logical row addresses X0-X6 (210) and column addresses Y0-Y6 (230), and such addresses being mapped to physical row addresses (220) and column addresses (240). However, this is only one example, other DRAM may utilize very different memory mapping. In some embodiments, DRAM 100 is a part of a memory device providing for generic address scrambling, such as illustrated in FIG. 1 utilizing the generic address scrambler 130, to allow variation in design of DRAM 200.

Figure 3:
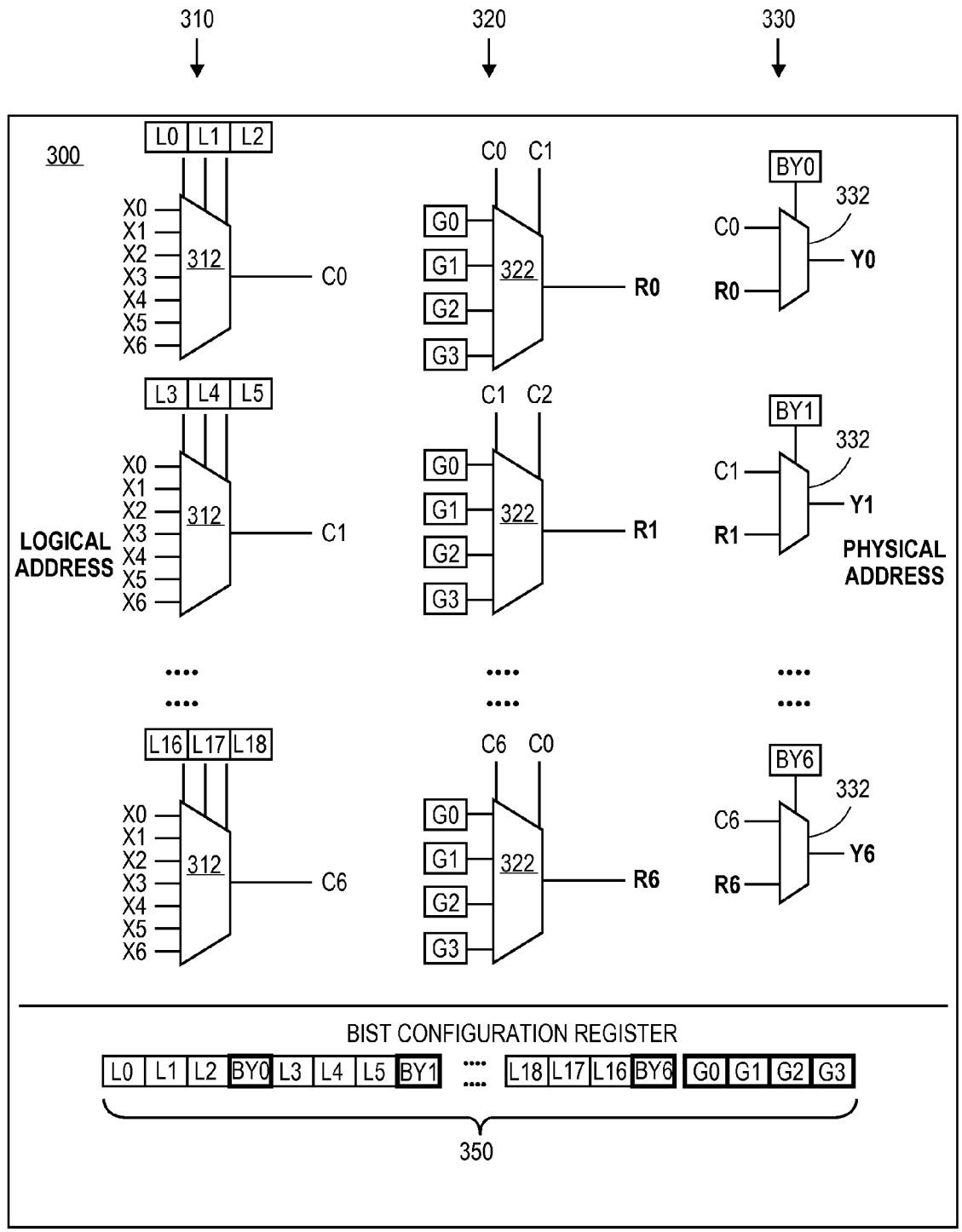
FIG. 3 is an illustration of an embodiment of a generic address scrambler for a stacked memory device.

FIG. 3 is an illustration of an embodiment of a generic address scrambler for a stacked memory device. In this illustration, the particular address scrambling implementation of generic address scrambler 300 illustrated in FIG. 3 is the addressing of the row address coordinates (X) of the DRAM 200 provided in FIG. 2. In some embodiments, a first stage 310 includes a set of multiplexers 312 for address remapping. In this illustration, C0 from the first multiplexer may be mapped to any bit from X0 through X6 based on the mux selects L0, L1, & L2. For example, for C0 to be mapped to X3 the mux selects L0, L1, L2=011. Address remapping is not required for all particular address mapping structures, and, if not required, then the output address may be set to the same as the input (example C0=X0, C1=X1, etc.).

In some embodiments, a second stage 320 includes a set of multiplexers 322 programmable as logic elements utilizing a truth table lookup that operates on adjacent addresses. G0, G1, G2, and G3 correspond to the output of a truth table for a particular logic gate. For example if the logical gate is an AND gate then G0=0, G1=0, G2=0, & G3=1. For simplicity in illustration, it is assumed for this example that all adjacent addresses use the lookup gate defined by G0, G1, G2, and G3 in the BIST configuration register. However, embodiments are not limited to this example, and different lookup values (and thus different logic gates) may be provided for each pair of adjacent addresses.

In some embodiments, a third stage 330 includes a third set of multiplexers 332 that may be used to bypass the programmable lookup gate (the second stage 322) in case the second stage is not required.

In some embodiments, the multiplexer controls for the first and third stage and the gate lookup (G0, G1, G2, and G3) of the second stage are a part of a BIST configuration register 350 of the memory device. However, embodiments are not limited to this example, and the multiplexer and lookup data may be stored in one or more other registers of the memory device.

Figure 4:
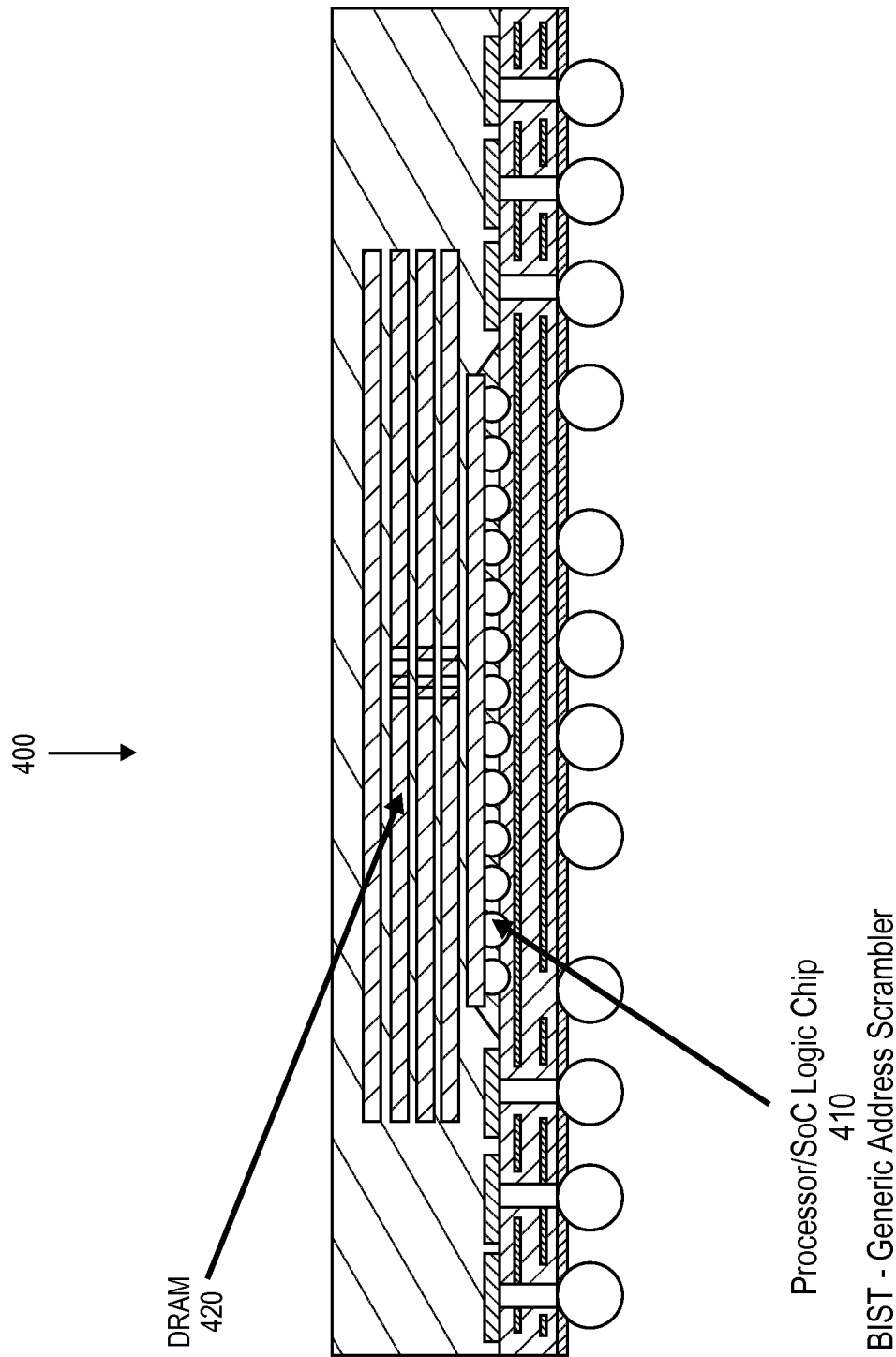
FIG. 4 is an illustration of embodiment of a stacked memory device.

FIG. 4 is an illustration of embodiment of a stacked memory device. In some embodiments, a stacked memory device 400 (such as a WideIO memory device) includes a memory stack including one more DRAM die layers 420 that is closely coupled with a logic chip 410, which may be an SoC or other system element. In some embodiments, the logic chip 410 may include a BIST test engine, where the test engine includes a generic programmable address scrambler for the mapping of logical addresses to physical addresses.

Figure 5:
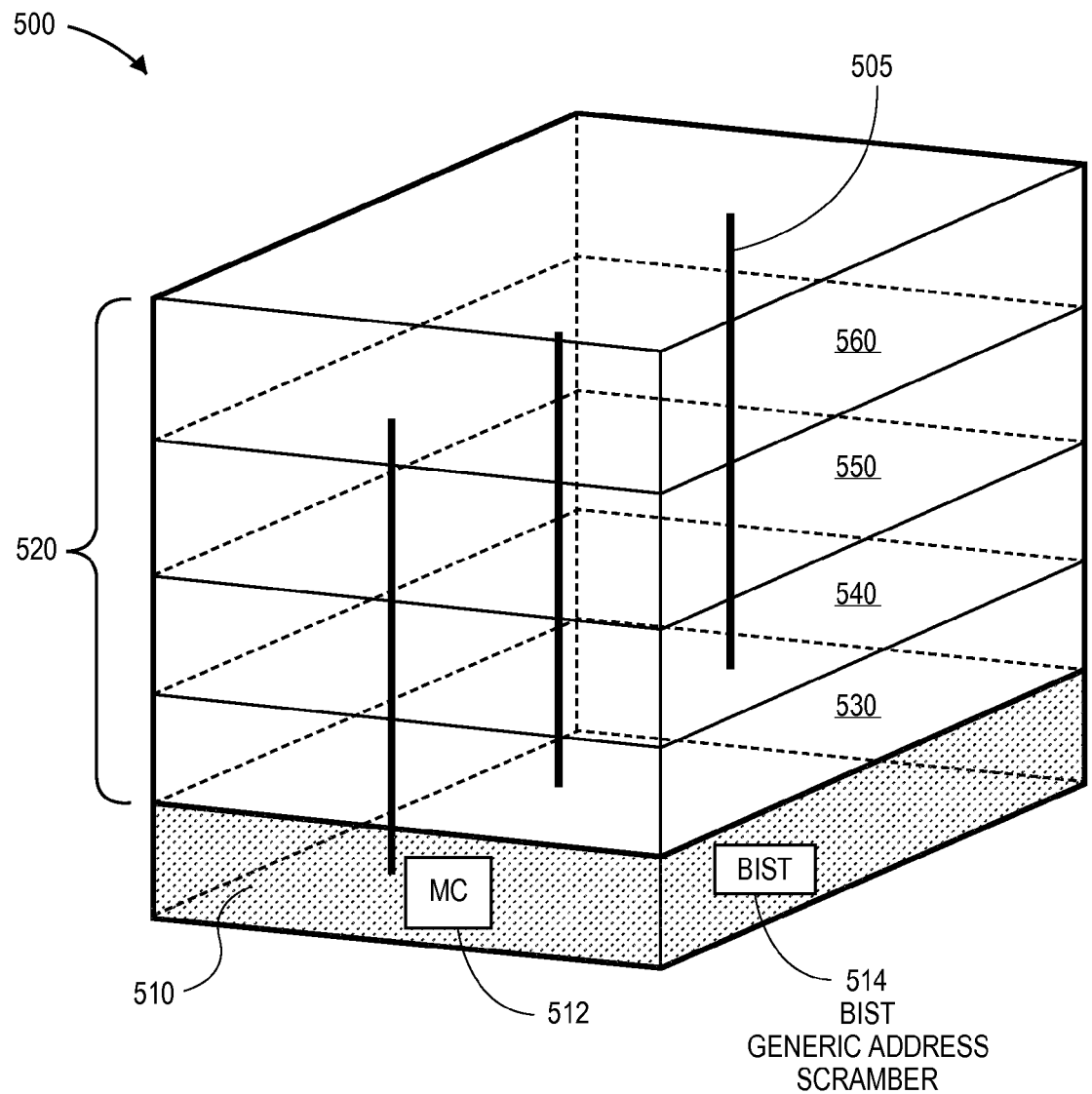
FIG. 5 illustrates an embodiment of a 3D stacked memory providing for memory testing.

FIG. 5 illustrates an embodiment of a 3D stacked memory providing for memory testing. In this illustration, a 3D stacked memory device 500 includes a logic chip system element 510 coupled with one or more DRAM memory die layers 520, also referred to herein as the memory stack, where the memory die layers may include one or more slices or portions, and may have one or more different channels. Each die layer may include a temperature compensated self-refresh (TCSR) circuit to address thermal issues, where the TCSR and a mode register (MR) may be a part of management logic of the device, and where the MC may include thermal offset bit(s) for adjustment of refresh rate by the TCSR. The die layers and the system element may be thermally coupled together. In some embodiments, the logic chip 510 may be a system on chip (SoC) or other similar element. The elements of this figure and the following figures are presented for illustration, and are not drawn to scale.

While FIG. 5 illustrates an implementation in which the logic chip 510 is coupled below the memory stack of one or more memory die layers 520, embodiments are not limited to this arrangement. For example, in some embodiments a system element 510 may be located adjacent to the memory stack 520, and thus may be coupled in a side-by-side arrangement with the memory stack 520.

In this illustration, the DRAM memory die layers include four memory die layers, these layers being a first memory die layer 530, a second memory die layer 540, a third memory die layer 550, and a fourth memory die layer 560. However, embodiments are not limited to any particular number of memory die layers in the memory stack 510, and may include a greater or smaller number of memory die layers. Among other elements, the system element 510 may include a memory controller 512 for the memory stack 520. In some embodiments, each memory die layer (with the possible exception of the top, or outermost, memory die layer, such as the fourth memory die layer 560 in this illustration) includes a plurality of through silicon vias (TSVs) 505 to provide paths through the silicon substrate of the memory die layers.

Figure 6:
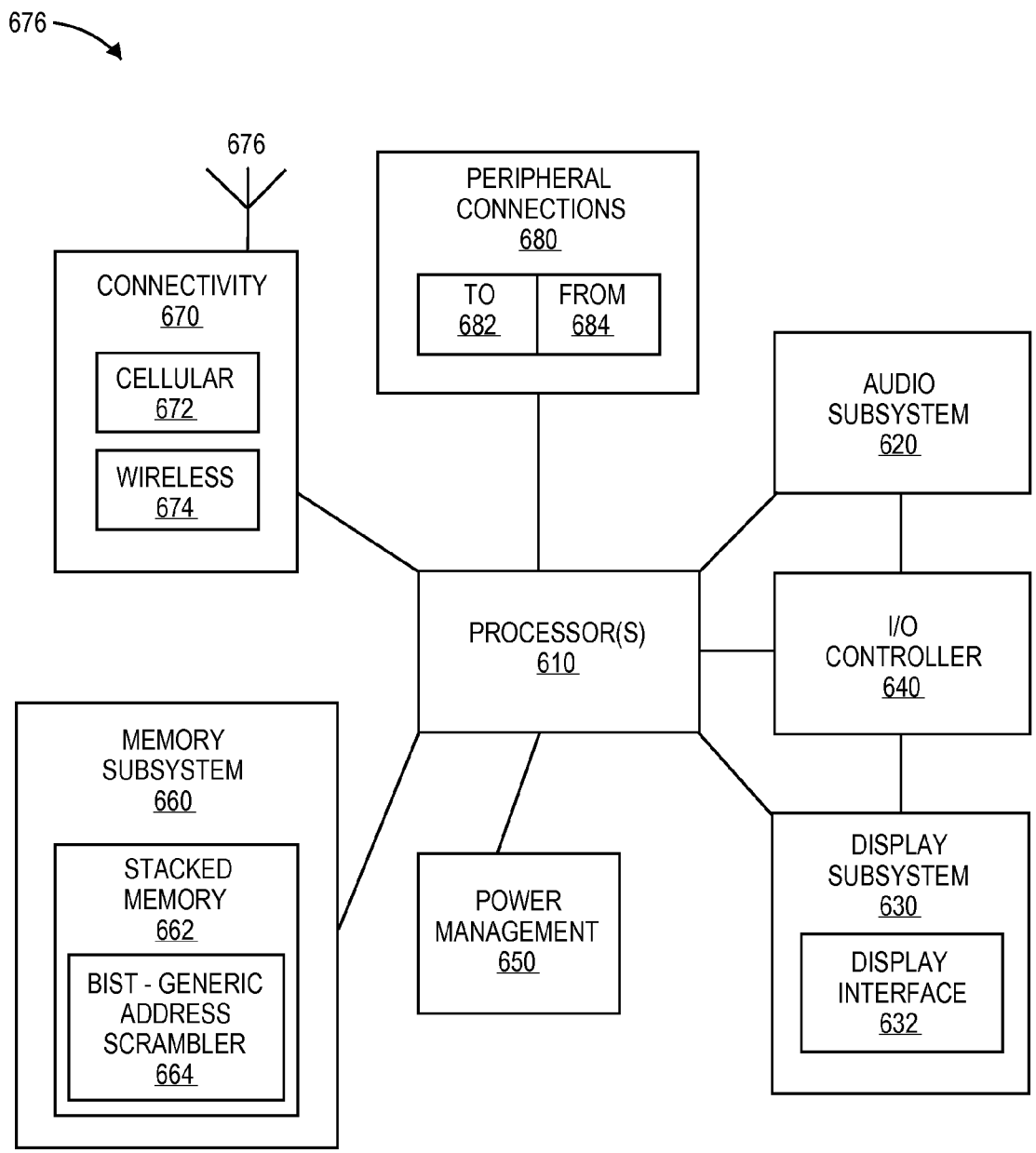
FIG. 6 is a block diagram to illustrate an embodiment of a mobile computing device including a stacked memory device.

FIG. 6 is a block diagram to illustrate an embodiment of a mobile computing device including a stacked memory device. Computing device 600 represents a computing device including a mobile computing device, such as a laptop or notebook computer, a netbook, a tablet computer (including a device having a touchscreen without a separate keyboard; a device having both a touchscreen and keyboard; a device having quick initiation, referred to as "instant on" operation; and a device that is generally connected to a network in operation, referred to as "always connected"), a mobile phone or smartphone, a wireless-enabled e-reader, or other wireless mobile device. It will be understood that certain of the components are shown generally, and not all components of such a device are shown in device 600. The components may be connected by one or more buses or other connections 605.

Device 600 includes processor 610, which performs the primary processing operations of device 600. Processor 610 can include one or more physical devices, such as microprocessors, application processors, microcontrollers, programmable logic devices, or other processing means. The processing operations performed by processor 610 include the execution of an operating platform or operating system on which applications, device functions, or both are executed. The processing operations include operations related to I/O (input/output) with a human user or with other devices, operations related to power management, operations, or both related to connecting device 600 to another device. The processing operations may also include operations related to audio I/O, display I/O, or both.

In one embodiment, device 600 includes audio subsystem 620, which represents hardware (such as audio hardware and audio circuits) and software (such as drivers and codecs) components associated with providing audio functions to the computing device. Audio functions can include speaker, headphone, or both such audio output, as well as microphone input. Devices for such functions can be integrated into device 600, or connected to device 600. In one embodiment, a user interacts with device 600 by providing audio commands that are received and processed by processor 610.

Display subsystem 630 represents hardware (such as display devices) and software (such as drivers) components that provide a display having visual, tactile, or both elements for a user to interact with the computing device. Display subsystem 630 includes display interface 632, which includes the particular screen or hardware device used to provide a display to a user. In one embodiment, display interface 632 includes logic separate from processor 610 to perform at least some processing related to the display. In one embodiment, display subsystem 630 includes a touchscreen device that provides both output and input to a user.

I/O controller 640 represents hardware devices and software components related to interaction with a user. I/O controller 640 can operate to manage hardware that is part of audio subsystem 620, a display subsystem 630, or both such subsystems. Additionally, I/O controller 640 illustrates a connection point for additional devices that connect to device 600 through which a user might interact with the device. For example, devices that can be attached to device 600 might include microphone devices, speaker or stereo systems, video systems or other display device, keyboard or keypad devices, or other I/O devices for use with specific applications such as card readers or other devices.

As mentioned above, I/O controller 640 may interact with audio subsystem 620, or display subsystem 630, or both such subsystems. For example, input through a microphone or other audio device can provide input or commands for one or more applications or functions of device 600. Additionally, audio output can be provided instead of or in addition to display output. In another example, if display subsystem includes a touchscreen, the display device also acts as an input device, which can be at least partially managed by I/O controller 640. There can also be additional buttons or switches on device 600 to provide I/O functions managed by I/O controller 640.

In one embodiment, I/O controller 640 manages devices such as accelerometers, cameras, light sensors or other environmental sensors, or other hardware that can be included in device 600. The input can be part of direct user interaction, as well as providing environmental input to the device to influence its operations (such as filtering for noise, adjusting displays for brightness detection, applying a flash for a camera, or other features).

In one embodiment, device 600 includes power management 650 that manages battery power usage, charging of the battery, and features related to power saving operation.

In some embodiments, memory subsystem 660 includes memory devices for storing information in device 600. The processor 610 may read and write data to elements of the memory subsystem 660. Memory can include nonvolatile (having a state that does not change if power to the memory device is interrupted), volatile (having a state that is indeterminate if power to the memory device is interrupted) memory devices, or both such memories. Memory 660 can store application data, user data, music, photos, documents, or other data, as well as device data (whether long-term or temporary) related to the execution of the applications and functions of device 600.

In some embodiments, the memory subsystem 660 may include a stacked memory device 662 including a memory stack of one more memory die layers, wherein the stacked memory device 662 includes a BIST test engine having a generic address scrambler 664 for handling logical to physical address mapping of DRAM memory.

Connectivity 670 includes hardware devices (e.g., connectors and communication hardware for wireless communication, wired communication, or both) and software components (e.g., drivers, protocol stacks) to enable device 600 to communicate with external devices. The device could be separate devices, such as other computing devices, wireless access points or base stations, as well as peripherals such as headsets, printers, or other devices.

Connectivity 670 can include multiple different types of connectivity. To generalize, device 600 is illustrated with cellular connectivity 672 and wireless connectivity 674. Cellular connectivity 672 refers generally to cellular network connectivity provided by wireless carriers, such as provided via 4G/LTE (Long Term Evolution), GSM (global system for mobile communications) or variations or derivatives, CDMA (code division multiple access) or variations or derivatives, TDM (time division multiplexing) or variations or derivatives, or other cellular service standards. Wireless connectivity 674 refers to wireless connectivity that is not cellular, and can include personal area networks (such as Bluetooth), local area networks (such as Wi-Fi), wide area networks (such as WiMax), and other wireless communications. Connectivity may include one or more omnidirectional or directional antennas 676.

Peripheral connections 680 include hardware interfaces and connectors, as well as software components (e.g., drivers, protocol stacks) to make peripheral connections. It will be understood that device 600 could both be a peripheral device ("to" 682) to other computing devices, as well as have peripheral devices ("from" 684) connected to it. Device 600 may commonly include a "docking" connector to connect to other computing devices for purposes such as managing (such as downloading, uploading, changing, or synchronizing) content on device 600. Additionally, a docking connector can allow device 600 to connect to certain peripherals that allow device 600 to control content output, for example, to audio-visual or other systems.

In addition to a proprietary docking connector or other proprietary connection hardware, device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Figure 7:
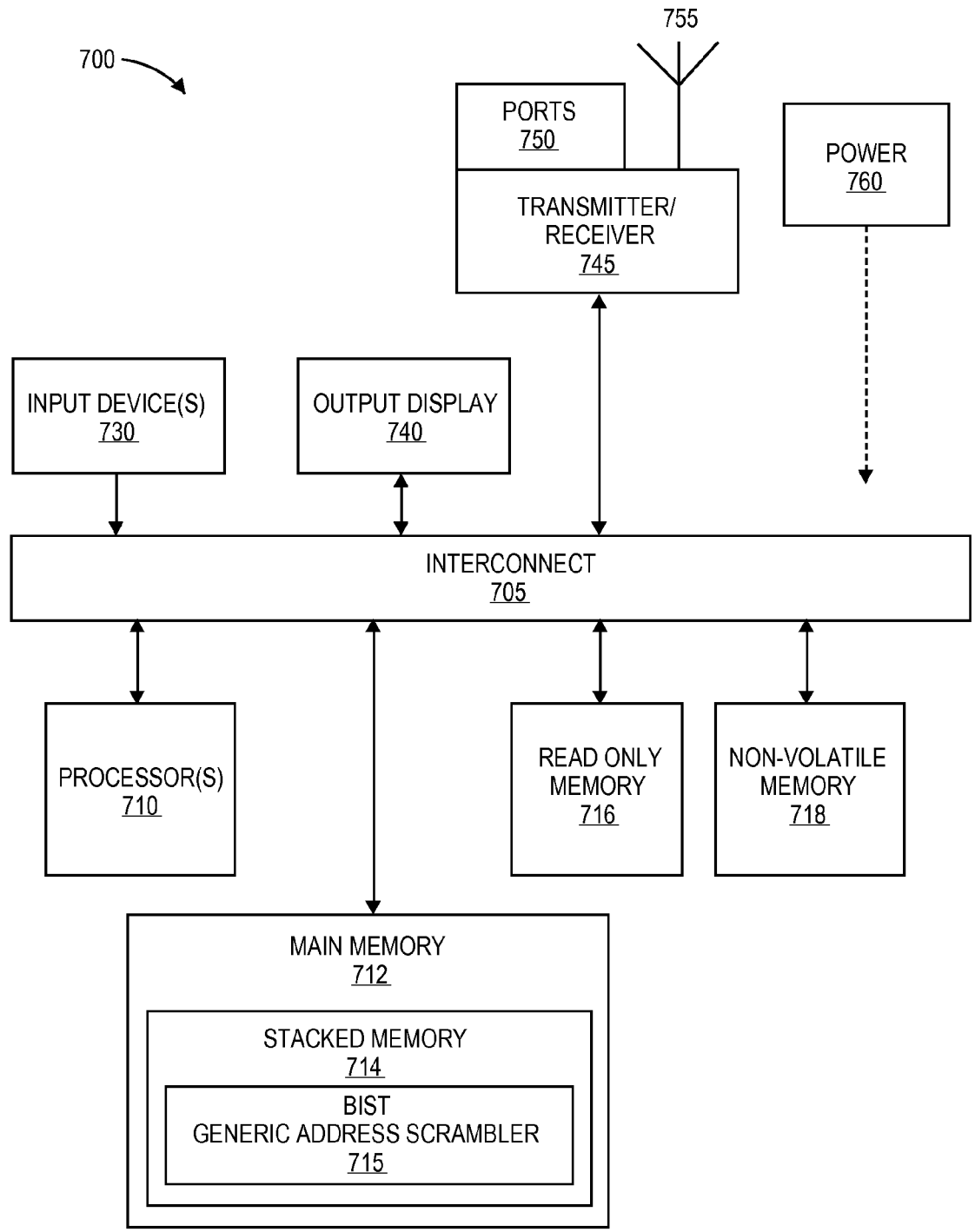
FIG. 7 illustrates an embodiment of a computing system including stacked memory.

FIG. 7 illustrates an embodiment of a computing system including stacked memory. The computing system may include a computer, server, game console, or other computing apparatus. In this illustration, certain standard and well-known components that are not germane to the present description are not shown. Under some embodiments, the computing system 700 comprises an interconnect or crossbar 705 or other communication means for transmission of data. The computing system 700 may include a processing means such as one or more processors 710 coupled with the interconnect 705 for processing information. The processors 710 may comprise one or more physical processors and one or more logical processors. The interconnect 705 is illustrated as a single interconnect for simplicity, but may represent multiple different interconnects or buses and the component connections to such interconnects may vary. The interconnect 705 shown in FIG. 7 is an abstraction that represents any one or more separate physical buses, point-to-point connections, or both connected by appropriate bridges, adapters, or controllers.

In some embodiments, the computing system 700 further comprises a random access memory (RAM) or other dynamic storage device or element as a main memory 712 for storing information and instructions to be executed by the processors 710. RAM memory includes dynamic random access memory (DRAM), which requires refreshing of memory contents, and static random access memory (SRAM), which does not require refreshing contents, but at increased cost. In some embodiments, main memory may include active storage of applications including a browser application for using in network browsing activities by a user of the computing system. DRAM memory may include synchronous dynamic random access memory (SDRAM), which includes a clock signal to control signals, and extended data-out dynamic random access memory (EDO DRAM). In some embodiments, memory of the system may include certain registers or other special purpose memory.

In some embodiments, the main memory 712 includes stacked memory 714, wherein the stacked memory includes a BIST test engine having a generic address scrambler 715.

The computing system 700 also may comprise a read only memory (ROM) 716 or other static storage device for storing static information and instructions for the processors 710. The computing system 700 may include one or more non-volatile memory elements 718 for the storage of certain elements In some embodiments, the computing system 700 includes one or more input devices 730, where the input devices include one or more of a keyboard, mouse, touch pad, voice command recognition, gesture recognition, or other device for providing an input to a computing system.

The computing system 700 may also be coupled via the interconnect 705 to an output display 740. In some embodiments, the display 740 may include a liquid crystal display (LCD) or any other display technology, for displaying information or content to a user. In some environments, the display 740 may include a touch-screen that is also utilized as at least a part of an input device. In some environments, the display 740 may be or may include an audio device, such as a speaker for providing audio information.

One or more transmitters or receivers 745 may also be coupled to the interconnect 705. In some embodiments, the computing system 700 may include one or more ports 750 for the reception or transmission of data. The computing system 700 may further include one or more directional or omnidirectional antennas 755 for the reception of data via radio signals.

The computing system 700 may also comprise a power device or system 760, which may comprise a power supply, a battery, a solar cell, a fuel cell, or other system or device for providing or generating power. The power provided by the power device or system 760 may be distributed as required to elements of the computing system 700.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form. There may be intermediate structure between illustrated components. The components described or illustrated herein may have additional inputs or outputs which are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, floppy diskettes, optical disks, compact disk read-only memory (CD-ROM), and magneto-optical disks, read-only memory (ROM), random access memory (RAM), erasable programmable read-only memory (EPROM), electrically-erasable programmable read-only memory (EEPROM), magnet or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present invention. It will be apparent to those skilled in the art that many further modifications and adaptations can be made. The particular embodiments are not provided to limit the invention but to illustrate it. The scope of the embodiments of the present invention is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example of the present invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the present invention, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

What is claimed is:

1. A memory device comprising:
    a memory stack including one or more of coupled memory elements;
    a built-in self-test circuit, the built-in self-test circuit including a generic programmable address scrambler for mapping of logical addresses to physical addresses for the memory elements; and
    one or more registers to hold programming values for the generic programmable address scrambler;
    wherein the generic programmable address scrambler includes a plurality of stages, a first stage of the plurality of stages including a first plurality of multiplexers to receive a logical address, the first stage to remap a plurality of elements of the logical address to produce a first plurality of values.

2. The memory device of claim 1, wherein the one or more registers are to hold values to program the generic programmable address scrambler for a particular memory element.

3. The memory device of claim 1, wherein the one or more registers include a first set of program values as selection values for the first set of multiplexers.

4. The memory device of claim 1, wherein a second stage of the plurality of stages includes a second plurality of multiplexers to receive values of the first plurality of values, the second set of multiplexers to be programmed to perform functions of logic gates.

5. The memory device of claim 4, wherein the one or more registers include a plurality of lookup values for each of the second plurality of multiplexers.

6. The memory device of claim 4, wherein a third stage of the plurality of stages includes a third set of multiplexers, each of the second set of multiplexers being switchable to bypass the operation of the second plurality of multiplexers.

7. A logic element for a memory device comprising:
    a memory controller for a memory stack of the memory device;
    a built-in self-test circuit, the built-in self-test circuit including a generic programmable address scrambler for mapping for logical addresses to physical addresses for the memory stack; and
    a configuration register to hold programming values for the generic programmable address scrambler;
    wherein the generic programmable address scrambler includes a plurality of stages, a first stage of the plurality of stages including a first plurality of multiplexers to receive a logical address, the first stage to remap a plurality of elements of the logical address to produce a first plurality of values.

8. The logic element of claim 7, wherein a second stage of the plurality of stages includes a second plurality of multiplexers to receive values of the first plurality of values, the second set of multiplexers to be programmed to perform functions of logic gates.

9. The logic element of claim 8, wherein a third stage of the plurality of stages includes a third set of multiplexers, each of the second set of multiplexers being switchable to bypass the operation of the second plurality of multiplexers.

10. A system including;
    a bus to connect elements of the system;
    a processor coupled with the bus to process data for the system;
    a transmitter to transmit data, a receiver to receive data, or both;
    an omnidirectional antenna for data transmission, data reception or both; and
    memory coupled to the bus to hold data for processing by the processor, the memory including a stacked memory device, the stack memory device including:
        a memory stack including one or more of coupled memory elements,
        a built-in self-test circuit, the built-in self-test circuit including a generic programmable address scrambler for mapping for logical addresses to physical addresses for the memory elements, and
        one or more registers to hold programming values for the generic programmable address scrambler;
        wherein the generic programmable address scrambler includes a plurality of stages, a first stage of the plurality of stages including a first plurality of multiplexers to receive a logical address, the first stage to remap a plurality of elements of the logical address to produce a first plurality of values.

11. The system of claim 10, wherein the one or more registers are to hold values to program the generic programmable address scrambler for a particular memory element.

12. The system of claim 10, wherein the one or more registers include a first set of program values as selection values for the first set of multiplexers.

13. The system of claim 10, wherein a second stage of the plurality of stages includes a second plurality of multiplexers to receive values of the first plurality of values, the second set of multiplexer to be programmed to perform functions of logic gates.

14. The system of claim 13, wherein the one or more registers include a plurality of lookup values for each of the second plurality of multiplexers.

15. The system of claim 13, wherein a third stage of the plurality of stages includes a third set of multiplexers, each of the second set of multiplexers being switchable to bypass the operation of the second plurality of multiplexers.

16. The system of claim 10, wherein the system is a computing system.

17. The system of claim 10, wherein the system is a tablet computer.

* * * * *